(12) United States Patent
Lew

(10) Patent No.: US 8,062,423 B2
(45) Date of Patent: Nov. 22, 2011

(54) CRYSTAL-GROWING FURNACE WITH CONVECTIONAL COOLING STRUCTURE

(75) Inventor: Shiow-Jeng Lew, Taipei (TW)

(73) Assignee: Green Energy Technology Inc., Taipei (TW)

( * ) Notice: Subject to any disclaimer, the term of this patent is extended or adjusted under 35 U.S.C. 154(b) by 80 days.

(21) Appl. No.: 12/153,545

(22) Filed: May 21, 2008

(65) Prior Publication Data

US 2009/0158995 A1 Jun. 25, 2009

(30) Foreign Application Priority Data

Dec. 21, 2007 (TW) .............................. 96149221 A

(51) Int. Cl.
*C30B 11/02* (2006.01)
*C30B 28/06* (2006.01)

(52) U.S. Cl. ........ 117/202; 117/200; 117/201; 117/204; 117/206; 117/223

(58) Field of Classification Search ........... 117/200–224
See application file for complete search history.

(56) References Cited

U.S. PATENT DOCUMENTS

| | | | | |
|---|---|---|---|---|
| 5,312,600 A | * | 5/1994 | Kamio et al. | 117/213 |
| 5,746,824 A | * | 5/1998 | Nemetz | 117/13 |
| 5,849,080 A | * | 12/1998 | Okuno | 117/222 |
| 5,853,480 A | * | 12/1998 | Kubota et al. | 117/217 |
| 5,968,266 A | * | 10/1999 | Iino et al. | 117/217 |
| 5,997,635 A | * | 12/1999 | Kubota et al. | 117/14 |
| 6,036,776 A | * | 3/2000 | Kotooka et al. | 117/217 |
| 6,080,238 A | * | 6/2000 | Ito | 117/30 |
| 6,858,076 B1 | * | 2/2005 | Nakajima et al. | 117/13 |
| 7,060,133 B2 | * | 6/2006 | Nawata et al. | 117/213 |
| 7,291,225 B2 | * | 11/2007 | Chen et al. | 117/217 |
| 7,524,371 B2 | * | 4/2009 | Yokoyama et al. | 117/14 |
| 2009/0158995 A1 | * | 6/2009 | Lew | 117/200 |
| 2009/0188426 A1 | * | 7/2009 | Lew et al. | 117/206 |
| 2009/0211519 A1 | * | 8/2009 | Lew et al. | 117/217 |

* cited by examiner

*Primary Examiner* — Michael Kornakov
*Assistant Examiner* — Kenneth A Bratland, Jr.
(74) *Attorney, Agent, or Firm* — Bacon & Thomas, PLLC

(57) ABSTRACT

A crystal-growing furnace with a convectional cooling structure includes a furnace body, a heating room, and at least one heater. The heating room is accommodated in the furnace body, and includes an upper partition, a plurality of side partitions, and a lower partition. The upper partition is provided with an upper opening, and the lower partition with a central opening. Further, the heating room is provided with an upper door, a lower door, an upper driver, and a lower driver. When silicon slurry is to be cooled and solidified, cooling gaseous stream flows into a lower portion of the heating room through the central opening. Then the upper opening is opened by the upper door which is driven by the upper driver, so that heated gaseous stream is discharged from the upper opening and flows downward along furnace inside wall, and flows back to the heating room from the central opening. Therefore, an automatic convectional circulating cooling flow field can be formed, such that the silicon slurry can be cooled quickly with time saved and production efficiency improved. Further, in the process of cooling and crystal growing from the silicon slurry, solidification and crystallization start from bottom to upward of the silicon slurry, such that inner stress and corner fracture may not be occurred to the silicon crystal ingots, and that a desirable quality of the silicon crystal ingots can be obtained.

11 Claims, 5 Drawing Sheets

CRYSTAL-GROWING FURNACE WITH CONVECTIONAL COOLING STRUCTURE

BACKGROUND OF THE INVENTION

1. Field of the Invention

The present invention relates to a furnace for growing multiple crystals of silicon, more particularly, to a crystal-growing furnace with a convectional cooling structure.

2. Description of Related Art

Referring to FIG. 1, a schematic view illustrating a conventional crystal-growing furnace, a heating room 91 is provided inside the crystal-growing furnace, where an insulating cover 911, a heater 912, a crucible 913, and a supporting table 914 is arranged in the heating room 91.

As shown in FIG. 1, silicon slurry is heated, by the heater 912, to a molten state, and when in a crystal-growing process, the insulating cover 911 is lifted so that cooling gaseous stream can be introduced into the heating room 91 from under the insulating cover 911. However, the supporting table 914 has a great bulk, and so a relatively great heat capacity, making it difficult for the underneath of the crucible 913, loaded with the silicon slurry, to be cooled despite the cooling gaseous stream. As a result, the silicon slurry at the bottom of the crucible 913 cannot have a desirable crystal-growing temperature, though the silicon slurry at the upper and side parts, in particular corners, of the crucible has been cooled and thus solidified already.

When the silicon slurry turns from a liquid phase into a solid phase, the volume thereof expands about 9.5%. In the conventional crystal-growing process of silicon slurry, crystal growth starts from the upper part of the crucible 913, then to the side part and eventually to the central part of the crucible 913. That is to say, the silicon slurry at the upper part and the peripheral part of the crucible will be solidified first, leaving an expansion pressure, produced from the later-solidified silicon slurry at the central part of the crucible 913, cannot be released upward and out of the upper part of the crucible 913, and as such, an internal stress is formed. Such internal stress will now and then cause fracture around the crystal ingots, particularly more serious at the corners of the crystal ingots. Even if the fracture is not obvious, the crystal ingots or chips might be fractured when a later cutting process is performed. As a result, the production of crystal ingots fails to have a desirable quality.

Moreover, during the crystal-growing process, the insulating cover 911 is lifted up, making inner wall of the insulating cover 911 rub against an upper board 910, such that bits of graphite will be peeled off and thus contaminate the crystal ingots of silicon. When annealing, the insulating cover 911 is lowered down so as to close the heating room 91, and is lifted up again for cooling purpose. Such moving up and down of the insulating cover 911 makes bits of graphite fall into the silicon slurry which thus contains more carbon, and as a result, quality of the crystal ingots of silicon is downgraded. Further, since the inner wall of the insulating cover 911 rubs against the upper board 910 for quite a long time, a gap between the inner wall of the insulating cover 911 and the upper board 910 becomes greater, and that the situation of heat loss gets seriously day by day.

Still further, in order to shorten the duration of cooling, six side partitions of the heating room 91 are constructed by a single heat insulating layer 92 made of graphite, without any additional insulating layer to keep warm the heating room 91. Nevertheless, such a heat-insulating measure with a thin layer cannot gather heat effectively. In particular, after underneath of the insulating cover 911 is opened, it is necessary to lower temperature for the bottom of the crucible 913 so as to grow crystal uniformly from the crystal slurry. In the meantime, a greater electric power is required for maintaining high temperature at the upper part of the heating room 91. These make the crystal-growing process consume more electricity and time.

SUMMARY OF THE INVENTION

The present invention is to provide a crystal-growing furnace with a convectional cooling structure, comprising a furnace body, a heating room, and at least one heater.

The furnace body includes an upper body and a lower body, wherein the lower body is attached to underneath of the upper body so as to form an enclosed furnace chamber. A heating room is accommodated in the furnace chamber of the furnace body, where the heating room includes an upper partition, a plurality of side partitions, and a lower partition which form together an inner space. An outer space is defined between the plural side partitions and inner wall of the furnace body. The at least one heater is accommodated in the inner space of the heating room.

Further, the upper partition of the heating room is provided with an upper opening, and the lower partition with a central opening. The heating room is provided with an upper door, a lower door, an upper driver, and a lower driver. In the present invention, the upper driver is provided for selectively opening or closing the upper door corresponding to the upper opening of the upper partition. The lower driver is provided for selectively opening or closing the lower door corresponding to the central opening of the lower partition.

Therefore, when silicon slurry is to be cooled and solidified, cooling gaseous stream may flow into a lower portion of the heating room through the central opening. Then the upper opening is opened by the upper door which is driven by the upper driver, so that heated gaseous stream is discharged from the upper opening and flows downward along furnace wall. After having been cooled by the furnace wall, the gaseous stream flows back to the heating room from the central opening. Therefore, an automatic convectional circulating cooling flow field can be formed, such that the silicon slurry can be cooled quickly with time saved and production efficiency improved. Further, in the process of cooling and crystal growing from the silicon slurry, solidification and crystallization starts from bottom to upward of the silicon slurry, such that inner stress and corner fracture may not be occurred to silicon crystal ingots, and that a desirable quality of the silicon crystal ingots can be obtained.

Further, an inlet tube, having an exit, may be provided in the crystal-growing furnace, where the inlet tube extends deep into the furnace body. The exit is located in, and at the lower part of, the heating room, and adjacent to the central opening, such that argon can be introduced to assure cleanness of gas in the heating room and to improve quality of the silicon crystal ingots.

In the present invention, the upper driver may include a screw, or a hydraulic or pneumatic cylinder, and a driving motor, and so forth. Also, the lower driver may include a screw, or a hydraulic or pneumatic cylinder, and a driving motor, and so forth.

Still further, the plural partitions of the heating room are arrayed and fixed to underneath of the upper partition so as to form together an insulating upper-cover structure. The insulating upper-cover structure is fixed to the upper body, while the lower partition is fixed to the lower body. Therefore, when the lower partition moves upward along with the lower body which is attached to the underneath of the upper body, the insulating upper-cover structure can be readily corresponding to and covering on the top of the lower partition. Besides, according to the present invention, the heating room adopts a double-layer structure including an internal insulating layer (such as made of graphite) and an external insulating layer (such as made of alumina fiber). Therefore, the heating room can effect heat insulation through the internal graphite insulation layer, together with warm keeping by the external insulating layer, and that energy can be saved in the process of melting silicon material.

According to the present invention, the crystal-growing furnace further includes a supporting table having a table plate and a plurality of supporting pillars. The table plate is disposed inside the inner space of the heating room, and is fixed to the lower body by the plural supporting pillars. The at least one heater includes a bottom heater assembled together with the table plate of the supporting table.

In the present invention, the at least one heater may include a top heater fixed, in a suspension manner, to the upper body and positioned above the table plate. The top heater has a heating structure of at least two layers, for instance, including an upper heater and a lower heater which are of square frames. The lower heater, being formed as a hollow frame, has a periphery greater than that of the upper heater, where both the upper and lower heaters are formed together in a pyramid shape.

Further, the upper heater of the top heater may include two graphite electrodes which are electrically connected with the upper heater, respectively, so as to provide electrical power to the upper heater for heating purpose. Similarly, the lower heater of the top heater may include two graphite electrodes which are electrically connected with the lower heater, respectively, so as to provide electrical power to the lower heater for heating purpose. The upper partition is provided with a plurality of through holes, and that the plural graphite electrodes pass through the plural through holes and are then secured to the upper body.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
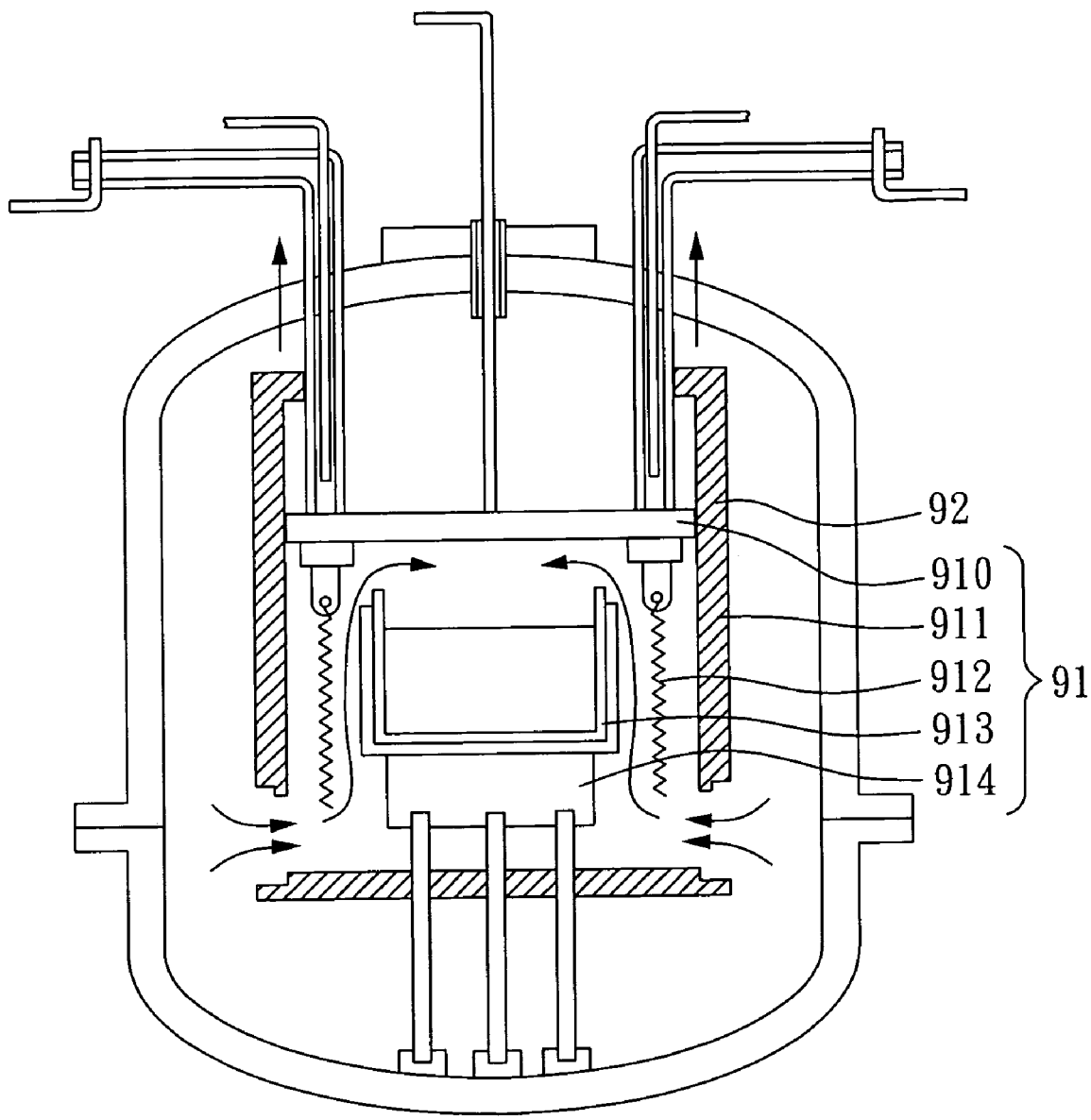
FIG. 1 is a schematic view illustrating a conventional crystal-growing furnace.
Figure 2:
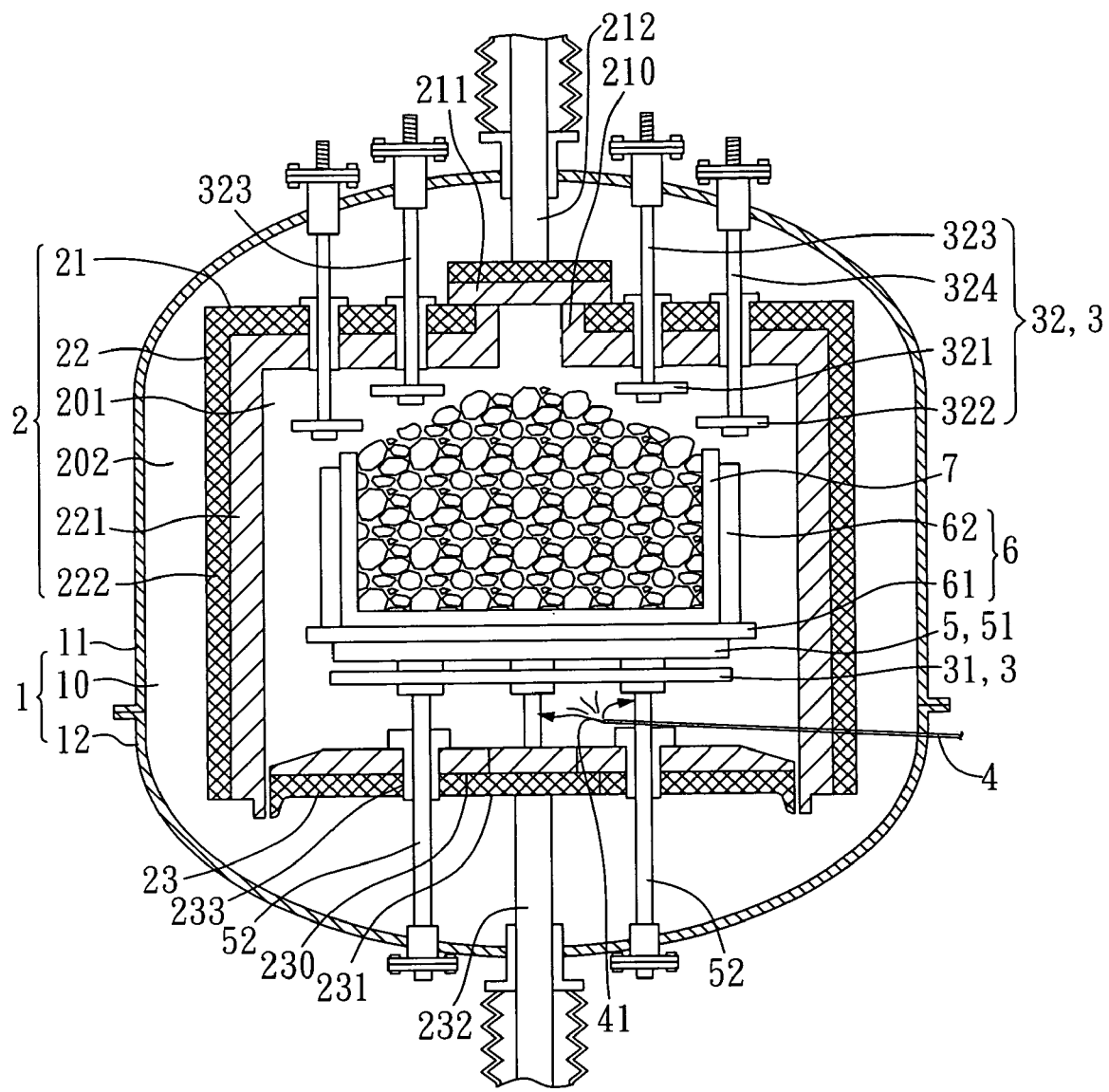
FIG. 2 is a cross-sectional view illustrating a crystal-growing furnace according to the present invention.

Referring to FIG. 2, a cross-sectional view illustrating a crystal-growing furnace according to the present invention, the crystal-growing furnace with a convectional cooling structure comprises a furnace body 1, a heating room 2, and at least one heater 3.

According to the present invention, the furnace body 1 includes an upper body 11 and a lower body 12, wherein the lower body 12 is attached, upward, to underneath of the upper body 11 so as to form an enclosed furnace chamber 10. A heating room 2 is accommodated in the furnace chamber 10 of the furnace body 1, where the heating room 2 includes an upper partition 21, four side partitions 22, and a lower partition 23 which form together an inner space 201. An outer space 202 is defined between the six partitions 21,22,23 and inner wall of the furnace body 1.

Further, the four partitions 22 of the heating room 2 are arrayed and fixed to underneath of the upper partition 21 so as to form together an insulating upper-cover structure. The insulating upper-cover structure is fixed to the upper body 11, while the lower partition 23 is fixed to the lower body 12. Therefore, when the lower partition 23 moves upward along with the lower body 12 which is attached to the underneath of the upper body 11, the insulating upper-cover structure can be readily corresponding to and covering on the top of the lower partition 23. Besides, according to the present invention, the heating room 2 adopts a double-layer structure including an internal insulating layer 221 (such as made of graphite) and an external insulating layer 222 (such as made of alumina fiber).

Therefore, the heating room 2 can effect heat insulation through the internal graphite insulation layer 221, together with warm keeping by the external alumina insulating layer 222, and that energy can be saved in the process of melting silicon and of the crystal growth.

As shown in FIG. 2, the heater 3 is accommodated in the inner space 201 of the heating room 2, and includes a top heater 32 fixed, in a suspension manner, to the upper body 11 and positioned above a table plate 51. The top heater 32 has a double-layer heating structure, for instance, including an upper heater 321 and a lower heater 322 which are of square hollow frames. The lower heater 322 has a periphery greater than that of the upper heater 321, where both the upper and lower heaters 321,322 are formed together in a pyramid shape so as to conform with the shape formed by stacking up silicon raw material shown in FIG. 2.

The upper heater 321 of the top heater 32 is electrically connected with two graphite electrodes 323, respectively, so as to provide electrical power to the upper heater 321 for heating purpose. Similarly, the lower heater 322 of the top heater 32 is electrically connected with two graphite electrodes 324, respectively, so as to provide electrical power to the lower heater 322 for heating purpose. The upper partition 21 is provided with eight through holes, and that the four graphite electrodes 323,324 pass through four of them and are secured to the upper body 11; whereas there are four graphite bars, which are electrically neutral connected, passing through other four through holes and are secured to the upper body 11.

Referring to FIG. 2 again, according to the present invention, the upper partition 21 of the heating room 2 is provided with an upper opening 210, and the lower partition 23 with a central opening 230. Further, the heating room 2 is provided with an upper door 211, a lower door 231, an upper driver 212, and a lower driver 232. In the present invention, the upper driver 212 includes a screw and a driving motor for selectively opening or closing the upper door 211 corresponding to the upper opening 210 of the upper partition 21. Also, the lower driver 232 includes another screw and driving motor for selectively opening or closing the lower door 231 corresponding to the central opening 230 of the lower partition 23.

Also referring to FIG. 2, a supporting table 5 includes a table plate 51 and a plurality of supporting pillars 52, where the table plate 51 is disposed inside the inner space 201 of the heating room 2, and the table plate 51 is fixed to the lower body 12 through the supporting pillars 52.

The heater 3 further includes a bottom heater 31 assembled together with the table plate 51 of the supporting table 5. A loading frame 6 is disposed on the table plate 51, and includes a lower plate 61 and four side plates 62, where the side plates 62 surround and stand on the lower plate 61 which envelop and form together an inner space for receiving a crucible 7.

The lower partition 23 of the heating room 2 is provided with a plurality of through holes 233 for passing therethrough a plurality of supporting pillars 52 which are then fixed to the lower body 12. In the present invention, each supporting pillar 52 can be graphite electrode pillar which not only can support against the bottom of the bottom heater 31, but also can form an electric connection for providing the bottom heater 31 with electric power for heat energy.

When heating starts, the upper and lower doors 211,231 of the heating room 2 are closed, and that the crucible 7 is heated both from above and beneath through the top and bottom heaters 32,31 so as to enhance efficiency in melting the silicon raw material in the crucible 7. Besides, the upper and lower heaters 321 and 322 of the top heater 32 are arranged and arrayed in a shape of pyramid so as to conform with the formation that the silicon raw material is stacked up. As such, the upper and lower heaters 321,322 can be closer to the silicon raw material. This will facilitate the silicon raw material absorbing heat energy at initial stage, and when the silicon raw material at top of the pyramid shape has been melted, the liquid molten silicon slurry flows directly into and among particles of the silicon raw material at inner part of the pyramid shape, expediting absorption of heat energy for the inner part of the silicon raw material. Therefore, a desirable cycle can be effected, such that the silicon raw material in the whole crucible 7 can be heated and melted quickly, and that much energy and time can be saved.

According to the present invention, as shown in FIG. 2, an inlet tube 4, having an exit 41, is provided for receiving argon, and extends deep into the furnace body 1. The exit 41 is located in, and at the lower part of, the heating room 2, and adjacent to the central opening 230, such that during heating process of the crystal-growing furnace, outside argon can be introduced, through the inlet tube 4, into the furnace so as to act as a protective gas. This makes impurities of the silicon raw material evaporate in the melting and deoxidizing process, and flow upward in the heating room 2 by following heated argon, where the argon flowed into bottom of the heating room 2 previously. During the process of deoxidization, the upper door 211 is slightly opened so that volatile can escape from the heating room 2 and then out of the crystal-growing furnace through an exhaust pipe, and that the heating room 2 can maintain therein a clean gas ambience so as to assure a desirable quality for silicon crystal ingots.

Figure 3:
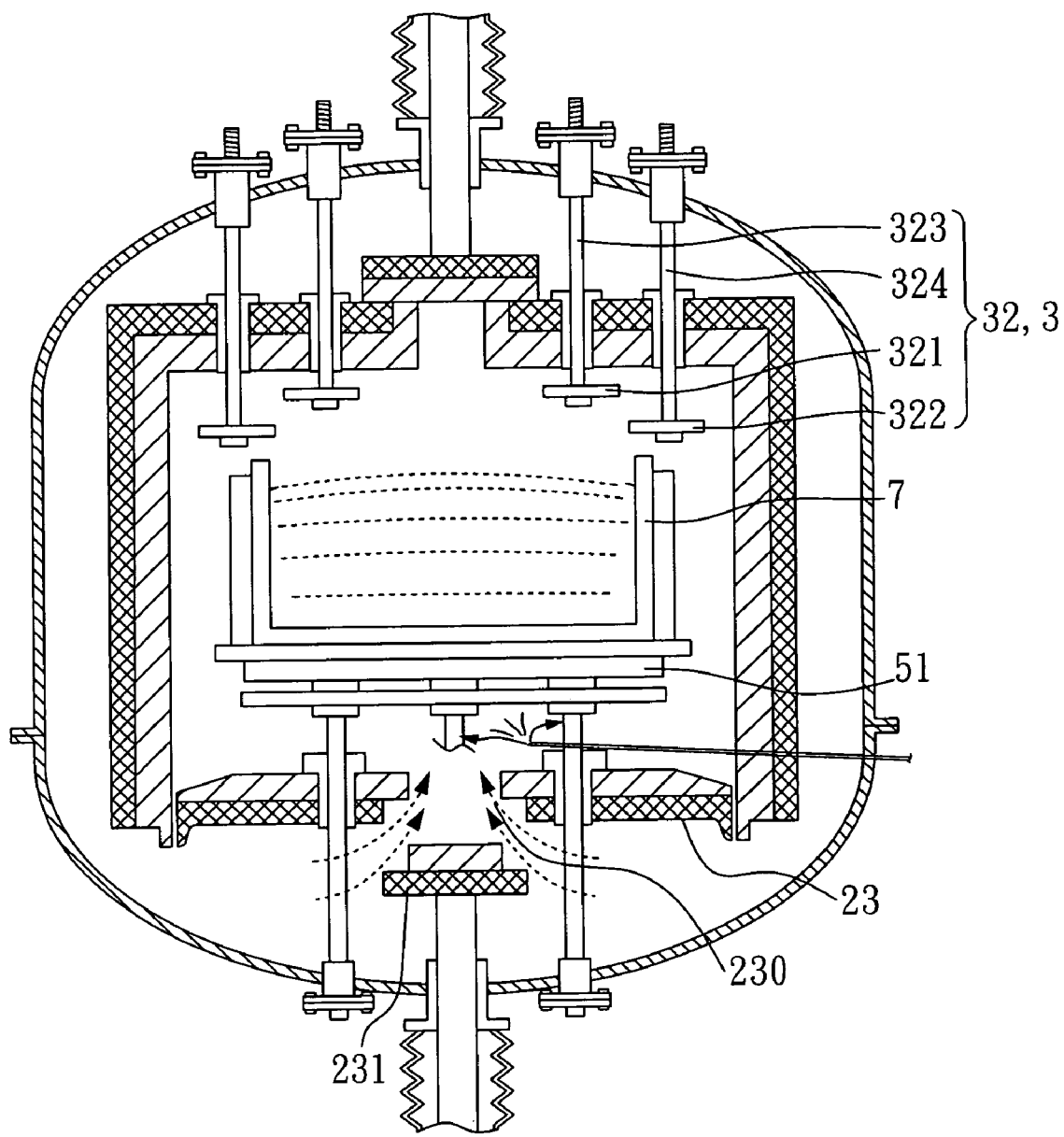
FIG. 3 is a cross-sectional view illustrating the crystal-growing furnace according to the present invention, when a lower door is opened.

Crystal growth starts when the silicon slurry gets cooled, as shown in FIG. 3, a cross-sectional view illustrating the crystal-growing furnace according to the present invention, when the lower door 231 is opened. When the silicon slurry in the crucible 7 enters into the stage of crystal growth, the upper door 211 is tightly closed again, and that electric power for the bottom heater 31 is shut off. Then the bottom of the crucible 7 cools down and that the lower door 231 of the heating room 2 is gradually opened, such that cool gaseous stream can flow therein to the bottom of the crucible 7 uniformly. In addition, the argon is introduced from the exit 41 of the inlet tube 4, adjacent to the lower door 231, and the silicon slurry can then be cooled, solidified and crystallized from the bottom of the crucible 7. Due to cooling gradually upward of the crucible 7, the silicon crystal grows and extends from bottom to the top of the crucible 7. At this moment, electric power supply to the top heater 32 is gradually reduced and thus temperature is lowered down gradually.

Therefore, during the solidified crystallization process, the pressure produced due to expansion of the silicon crystal can be introduced upward, and because the silicon slurry at the upper portion of the crucible 7 is still at a soft status, the pressure can be released without difficulty, until the silicon slurry is solidified fully and that the crystal growth is completed. As a result, the disadvantage of serious stress concentration, incurred in the conventional art because the silicon slurry around the crucible is solidified first and is thus pressed against by the later-solidified silicon crystal at the central part of the crucible, can be overcome. Further, since in the present invention the heating room 2 keeps warm well, less electric power is required for maintaining the gradually-solidified silicon crystal ingots at certain softness. This eliminates possibility of inner stress and fracture incurred during crystal growth for the silicon crystal ingots, and as such a desirable quality of silicon crystal ingots can be obtained, let alone energy can be saved.

As shown in FIG. 3, the lower partition 23, at the central opening 230, has a shorter contacting line with the lower door 231, and the lower door 231 has a lowest position as far as the heating room 2 is concerned. Besides, the lower partition 23 and the lower door 231 are far away from the open end of the crucible 7 and underneath the table plate 51. As a result, when in the process of crystal growth, the lower door 231 is opened and moves away slowly from the lower partition 23, graphite bits produced from rubbing each other for the lower door 231 and the lower partition 23 are insignificant. Moreover, the bits will never fall into the crucible 7, and thus will not contaminate the silicon crystal ingots in the crucible 7, such that a desirable quality of silicon crystal ingots can be assured.

Figure 4:
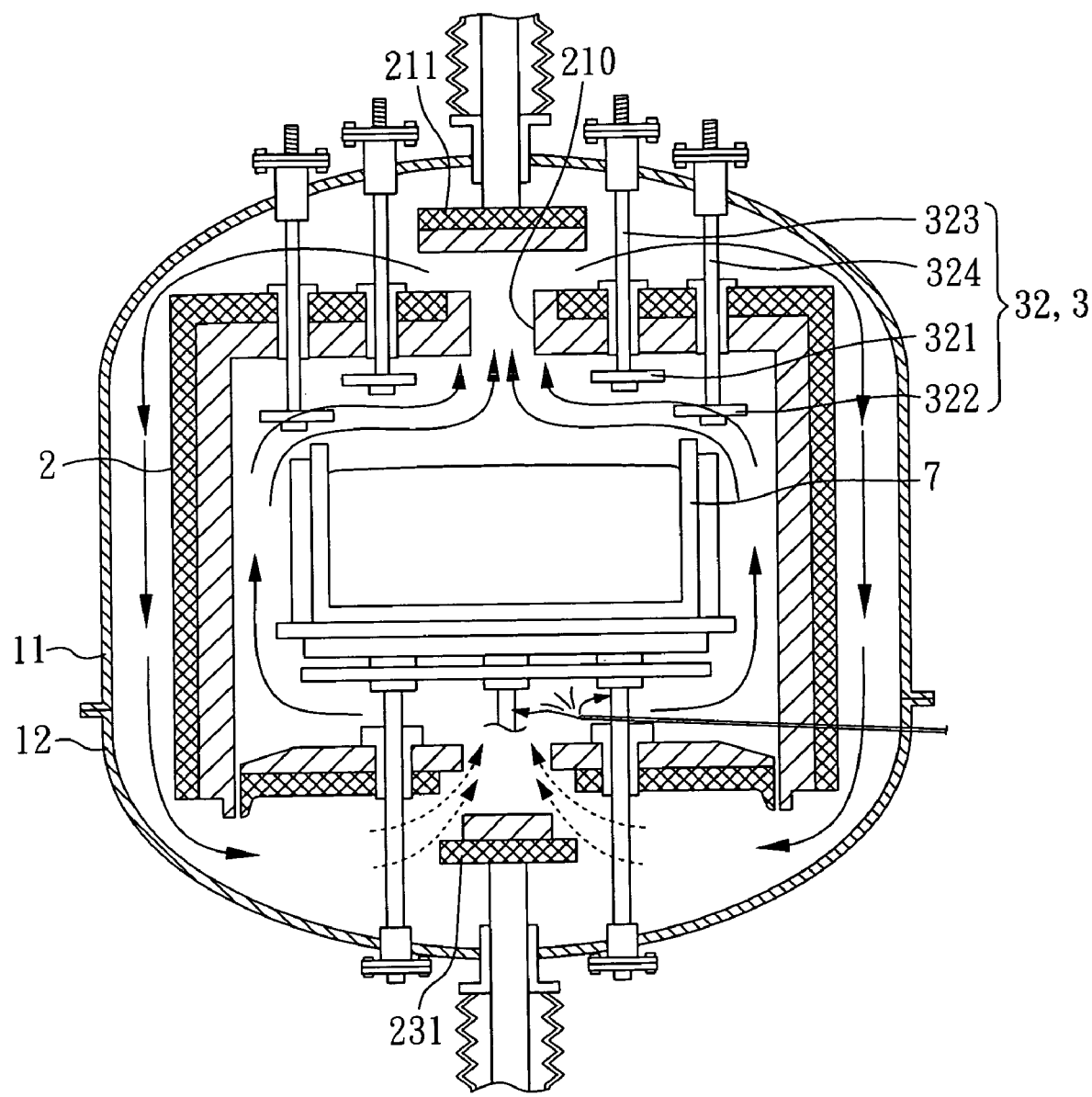
FIG. 4 is a cross-sectional view illustrating the crystal-growing furnace according to the present invention, when an upper door and the lower door are opened.

Now referring to FIG. 4, a cross-sectional view illustrating the crystal-growing furnace according to the present invention, when the upper door 211 and the lower door 231 are opened, the silicon slurry in the crucible 7 is proceeded with a cooling stage after the crystal growth has been finished. At this moment, the electric power of the top heater 32 is shut off, and the upper door 211 of the heating room 2 re-opened. Heated gaseous stream flows upward in the heating room 2 and is discharged from the upper opening 210. The furnace body 1 can be cooled by water showering or spraying outside so that the heated gaseous stream flows downward along the inner wall of the upper body 11 and of the lower body 12. Therefore, the heated gaseous stream is cooled through absorption of heat by the furnace wall, where the heated gaseous stream then flows back to the heating room 2 from the central opening 230. Repeatedly, as such, a convectional circulating cooling flow field can be formed, and that the silicon crystal ingots can be cooled quickly by natural flow circulation so as to save time.

Figure 5:
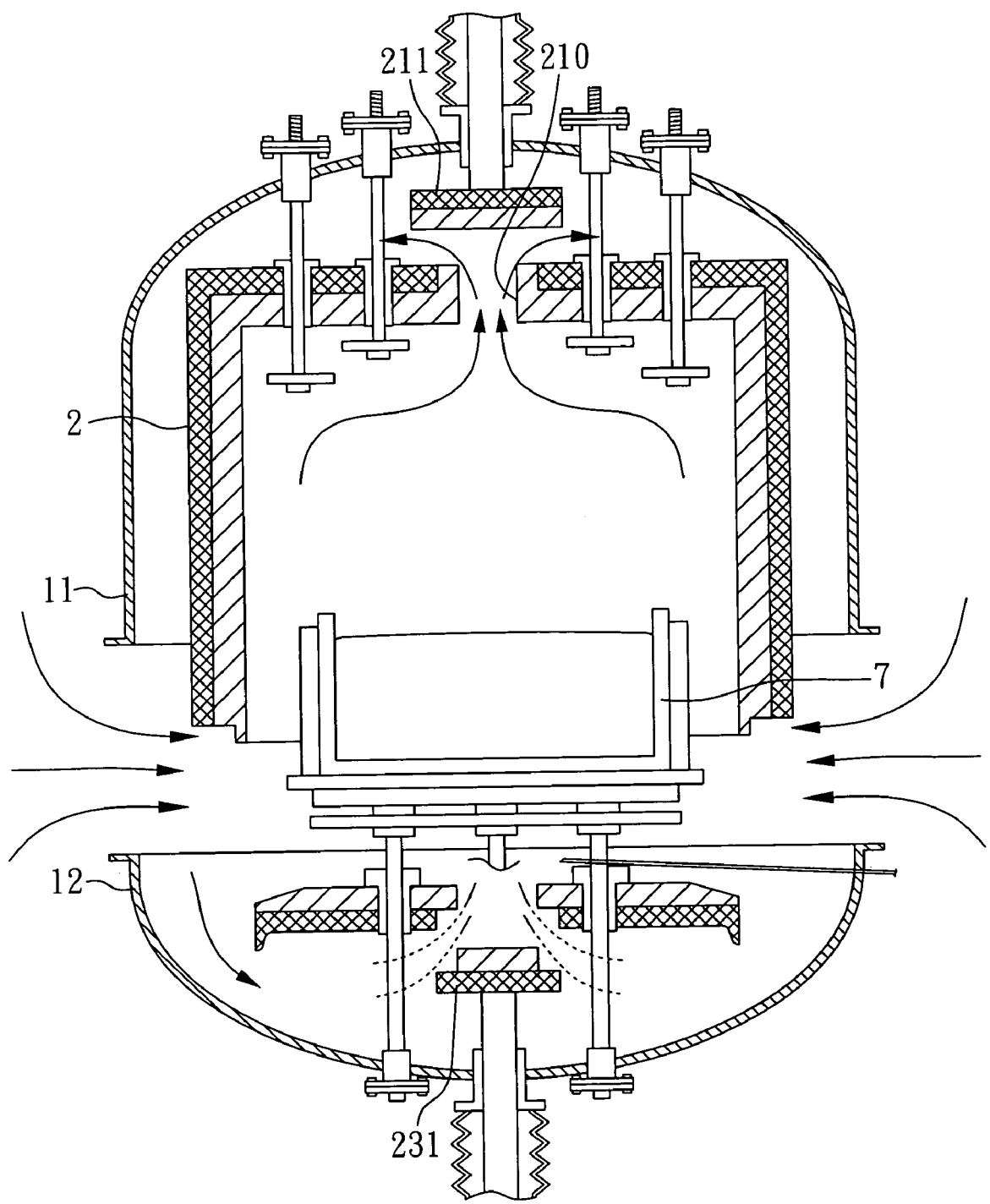
FIG. 5 is a cross-sectional view illustrating the crystal-growing furnace according to the present invention, when the upper door, the lower door, and a lower body are opened.

Further, referring to FIG. 5, a cross-sectional view illustrating the crystal-growing furnace according to the present invention, when the upper door 211, the lower door 231, and the lower body 12 are opened, in case inside of the furnace has been cooled down to a safety temperature, as shown, the lower body 12 is opened downward, so that a great amount of ambient air flows around the crucible 7 and to cool directly the silicon crystal ingots that have been grown already. Because cooling has been effected previously, cooling at this stage gets more speedily, so that the silicon crystal ingots can be taken off shortly, and that waiting time can be saved and production increased.

Given the above, the heating room 2, based on desirable heat insulation and warm keeping as well as effective heating manner, the volatile inside the silicon slurry can be driven out by opening or closing the upper and lower doors 211,231. In addition, by controlling the gaseous stream of cool field, the molten silicon slurry starts to be solidified, and thus crystal grown, from bottom to upward uniformly. The pressure incurred from solidification and expansion of the silicon slurry can be released toward upward of the silicon slurry not yet crystallized. As such, the silicon crystal ingots will not exist with inner stress or fracture. It is understood that, according to the present invention, the setbacks of the conventional art including non-uniform distribution of cool field gaseous stream, prior solidification from around and upper portion of the silicon slurry, and inner stress and corner fracture occurred in the crystal ingots after the crystal growth, can be overcome. Furthermore, according to the present invention, the gaseous stream of cool field can be appropriately controlled through the convectional circulating cooling flow field, so that the crystal growth can be realized from the silicon slurry with least heat energy and time consumption and that a desirable quality of silicon crystal ingots can be obtained. Besides, the manner of natural circulation can be adopted, such that through cooling at the furnace body 1, the crystal ingots can be cooled quickly. This saves waiting time for material replacement, and this increases production.

In other words, the present invention is much superior to the conventional art in terms of heating and melting silicon material, driving out volatile, silicon crystal growing until cooling of the crystal ingots, as well as total consumption on energy and time.

Although the present invention has been explained in relation to its preferred embodiments, it is to be understood that many other possible modifications and variations can be made without departing from the scope of the invention as hereinafter claimed.

What is claimed is:

1. A crystal-growing furnace with a convectional cooling structure, comprising:
    a furnace body, including an upper body and a lower body, wherein the lower body is attached below the upper body so as to form an enclosed furnace chamber; a heating room, being accommodated in the furnace chamber of the furnace body, and including an upper partition, a plurality of side partitions, and a lower partition which form together an inner space, and an outer space being defined between the plural side partitions and inner wall of the furnace body; and
    at least one heater, being accommodated in the inner space of the heating room;
    wherein the upper partition of the heating room is provided with an upper opening, and the lower partition with a central opening; and
    the heating room is provided with an upper door, a lower door, an upper driver, and a lower driver, wherein the upper driver is provided for selectively opening and closing the upper door corresponding to the upper opening of the upper partition, and wherein the lower driver is provided for selectively opening and closing the lower door corresponding to the central opening of the lower partition,
    wherein the central opening and the upper opening are configured to permit a cooling air stream to circulate therebetween when the upper door and the lower door are in an open position.

2. The crystal-growing furnace as claimed in claim 1 further comprising an inlet tube, which has an exit, extending deep into the furnace body, and the exit is located in, and at the lower part of, the heating room, and adjacent to the central opening.

3. The crystal-growing furnace as claimed in claim 1, wherein the upper driver includes a screw and a motor.

4. The crystal-growing furnace as claimed in claim 1, wherein the lower driver includes a screw and a motor.

5. The crystal-growing furnace as claimed in claim 1, wherein the plural partitions of the heating room are arrayed and fixed to underneath of the upper partition so as to form together an insulating upper-cover structure.

6. The crystal-growing furnace as claimed in claim 1, wherein the heating room adopts a double-layer structure including an internal insulating layer and an external insulating layer.

7. The crystal-growing furnace as claimed in claim 1, further comprising a supporting table having a table plate and a plurality of supporting pillars, wherein the table plate is disposed inside the inner space of the heating room, and is fixed to the lower body by the plural supporting pillars; and
    wherein the at least one heater includes a bottom heater assembled together with the table plate of the supporting table.

8. The crystal-growing furnace as claimed in claim 1, wherein the at least one heater includes a top heater fixed, in a suspension manner, to the upper body.

9. The crystal-growing furnace as claimed in claim 8, wherein the top heater includes an upper heater and a lower heater, where the lower heater has a periphery greater than that of the upper heater.

10. The crystal-growing furnace as claimed in claim 9, wherein the upper heater of the top heater includes two graphite electrodes which are electrically connected with the upper heater, respectively.

11. The crystal-growing furnace as claimed in claim 9, wherein the lower heater of the top heater includes two graphite electrodes which are electrically connected with the lower heater, respectively.

* * * * *